(12) United States Patent
Nelson et al.

(10) Patent No.: US 7,315,176 B2
(45) Date of Patent: Jan. 1, 2008

(54) ELECTRICAL TEST PROBES, METHODS OF MAKING, AND METHODS OF USING

(75) Inventors: Larre H. Nelson, Attleboro, MA (US); John M. Winter, Wrentham, MA (US)

(73) Assignee: Rika Denshi America, Inc., Attleboro, MA (US)

( * ) Notice: Subject to any disclaimer, the term of this patent is extended or adjusted under 35 U.S.C. 154(b) by 200 days.

(21) Appl. No.: 11/155,230

(22) Filed: Jun. 16, 2005

(65) Prior Publication Data

US 2005/0280433 A1    Dec. 22, 2005

Related U.S. Application Data

(60) Provisional application No. 60/580,221, filed on Jun. 16, 2004.

(51) Int. Cl.
*G01R 31/02* (2006.01)
(52) U.S. Cl. ........................... 324/761; 324/754
(58) Field of Classification Search ............ None
See application file for complete search history.

(56) References Cited

U.S. PATENT DOCUMENTS

| 3,416,125 A | 12/1968 | Theve |
| 3,435,168 A | 3/1969 | Cooney |
| 4,105,970 A | 8/1978 | Katz |
| 4,132,948 A | 1/1979 | Katz |
| 4,307,928 A | 12/1981 | Petlock, Jr. |
| 4,397,519 A | 8/1983 | Cooney |
| 4,438,397 A | 3/1984 | Katz |
| 4,508,405 A | 4/1985 | Damon et al. |
| 4,560,926 A | 12/1985 | Cornu et al. |
| 4,597,622 A | 7/1986 | Coe |
| 4,620,761 A | 11/1986 | Smith et al. |
| 5,014,004 A | 5/1991 | Kreibich et al. |
| 5,200,695 A | 4/1993 | Kazama |
| 5,410,260 A | 4/1995 | Kazama |
| 5,414,369 A | 5/1995 | Kazama |
| 5,461,326 A | 10/1995 | Woith et al. |
| 5,518,410 A | 5/1996 | Masami |
| 5,641,315 A | 6/1997 | Swart |
| 5,744,977 A | 4/1998 | Cuautla |
| 5,781,023 A | 7/1998 | Swart et al. |
| 5,791,914 A | 8/1998 | Loranger et al. |
| 5,801,544 A | 9/1998 | Swart |
| 5,990,697 A | 11/1999 | Kazama |
| 6,043,666 A | 3/2000 | Kazama |

(Continued)

OTHER PUBLICATIONS

European Search Report; International Application No: PCT/US2005/021530; Applicant's File Reference No. RIK-0003-F; International Filing Date Jun. 16, 2005; Date of Mailing Oct. 19, 2005.

(Continued)

*Primary Examiner*—Minh N. Tang
(74) *Attorney, Agent, or Firm*—Cantor Colburn LLP (57) ABSTRACT

Disclosed herein is an electronic test probe including a compression spring disposed in the housing in engagement with a plunger, the compression spring including a first section of coils including a first centerline and a second section of coils including a second centerline spaced apart from and parallel to the first centerline.

22 Claims, 8 Drawing Sheets

U.S. PATENT DOCUMENTS

| | | |
|---|---|---|
| 6,053,777 A | 4/2000 | Boyle |
| 6,152,744 A | 11/2000 | Maeda |
| 6,159,056 A | 12/2000 | Boyle |
| 6,190,181 B1 | 2/2001 | Affolter et al. |
| 6,193,524 B1 | 2/2001 | Chang |
| 6,275,054 B1 | 8/2001 | Boyle |
| 6,323,667 B1 | 11/2001 | Kazama |
| 6,341,962 B1 | 1/2002 | Sinclair |
| 6,377,059 B2 | 4/2002 | Vinther et al. |
| 6,396,293 B1 | 5/2002 | Vinther et al. |
| 6,464,511 B1 * | 10/2002 | Watanabe et al. .............. 439/66 |
| 6,652,326 B2 | 11/2003 | Boyle et al. |
| 6,667,629 B2 * | 12/2003 | Souza et al. ................. 324/754 |
| 6,696,850 B1 | 2/2004 | Sanders |
| 2002/0132514 A1 | 9/2002 | Feldman |

OTHER PUBLICATIONS

JP 2001-255340; Sep. 21, 2001; English abstract only; (2pgs).
JP 2004-069508; Mar. 4, 2004; English abstract only; (1pg).

* cited by examiner

ELECTRICAL TEST PROBES, METHODS OF MAKING, AND METHODS OF USING

RELATED APPLICATIONS

Priority is hereby claimed under 35 U.S.C. § 119(e) to commonly-owned U.S. Provisional Patent Application No. 60/580,221, which was filed on Jun. 16, 2004, and which is incorporated herein by reference in its entirety.

BACKGROUND

1. Technical Field

The disclosure relates generally to electronic test probes and, more particularly, to electronic test probes for testing integrated circuits (ICs).

2. Related Art

During testing, integrated circuit (IC) packages are removably mounted in sockets which in turn are mounted on a circuit substrate, commonly referred to as a device-under-test board, or DUT board. The sockets house individual electrical test probes for electrically connecting each terminal of a device to be tested to an individual circuit path on the DUT board. The DUT board is in turn electrically connected to computerized test equipment.

It is desirable to have a high integrity signal path from the test equipment to the device being tested and for the overall resistance of the signal path to be low and consistent. This is also true for each segment of the overall signal path—including the test probe housed in the test socket.

The electrical test probes can comprise electrically conductive metal components that are surface finished with an electrically noble metal such as gold or palladium cobalt. To assure the low and consistent resistance of the test probe, the metal components are precisely located in close proximity to each other, and the normal force between the components is kept high enough to keep the components in direct contact with each other and to break through any surface barriers that might be in place between the components.

It is desirable to have low and consistent resistance in electrical test probes. One way of achieving this is to ensure that electrical current flows from the sliding plunger to the barrel of the test probe with a minimum of contact resistance.

A need exists in the art for reliable, low contact resistance test probes and methods of making the same.

SUMMARY

Disclosed herein is an electronic test probe. The electronic test probe comprises a substantially cylindrical housing with a first end and a second end, and an opening disposed in the first end. A plunger is disposed in the housing, the plunger comprising a first end and a second end opposite the first end, the first end comprising a contact tip extending from the opening in the first end. A compression spring is disposed in the housing in engagement with the second end of the plunger, the compression spring comprising a first section of coils comprising a first centerline and a second section of coils comprising a second centerline spaced apart from and parallel to the first centerline.

Also disclosed herein is an electronic test probe comprising a substantially cylindrical housing with a first end and a second end, and an opening disposed in each of the first and second ends. A first plunger and a second plunger are disposed in the housing, each of the first and second plungers comprising a first end extending from one of the openings disposed in the housing and a second end comprising a bias-cut surface. A compression spring is disposed between the first and second plungers, the compression spring comprising a first end and a second end, the first and second ends of the compression spring each disposed in engagement with the bias-cut surface of one of the first and second plungers, the compression spring comprising a first section of coils comprising a first centerline and a second section of coils comprising a second centerline spaced apart from and parallel to the first centerline.

The above described and other features are exemplified by the following figures and detailed description. In the description, it should be noted that the terms "first," "second," and the like herein do not denote any order or importance, but rather are used to distinguish one element from another, and the terms "a" and "an" herein do not denote a limitation of quantity, but rather denote the presence of at least one of the referenced items. The modifier "about" used in connection with a quantity is inclusive of the stated value and has the meaning dictated by the context (e.g., includes the degree of error associated with measurement of the particular quantity). Unless specified otherwise, the term "diameter" refers to the average diameter of the coils of a spring section, as measured along the major axis of the spring section. Finally, unless defined otherwise, technical and scientific terms used herein have the same meaning as is commonly understood by one of skill in the art to which this invention belongs.

BRIEF DESCRIPTION OF THE DRAWINGS

Refer now to the figures, which are exemplary embodiments, and wherein like elements are numbered alike.

DETAILED DESCRIPTION OF THE PREFERRED EMBODIMENTS

Disclosed herein are electrical test probes comprising consistent and relatively low contact resistance (e.g., less than or equal to about 50 milliohms, more particularly about 25 milliohms to about 50 milliohms, more particularly still about 10 milliohms to about 35 milliohms), and methods of making and using the same. The test probes comprise a biasing member (e.g., compression spring members, cantilever beam biasing members, bellows contact biasing members, and/or the like, and combinations comprising at least one of the foregoing) that comprises at least two (2) sections, each of which comprises a centerline. The biasing members comprise spaced apart and parallel centerlines which, when used with certain plungers in the test probe, can force the exterior surface of the plungers against the interior of the barrel, ensuring that the majority of current flows through the barrel rather than through the spring, and providing relatively low contact resistance in comparison to other test probes without biasing members.

One exemplary embodiment of an electronic test probe 100 is shown in FIGS. 1A-1D, when taken together. As shown, test probe 100 can comprise a housing 112, two opposing plungers 120, and a biasing member 130. Although illustrated herein with two plungers, it should be understood that the compression spring and plunger arrangements disclosed herein are applicable to test probes with a single plunger. Housing 112 can comprise a substantially longitudinal cylindrical shape with opposing ends 112a,b, and an opening 114 disposed in each end 112a,b. Although illustrated herein as substantially cylindrical, it should be understood that the housing 112 can comprise other geometries, depending on the application. Housing 112 will be referred to hereinafter as a barrel, as it is sometimes referred to in the art.

Figures 1A, 1B, 1C:
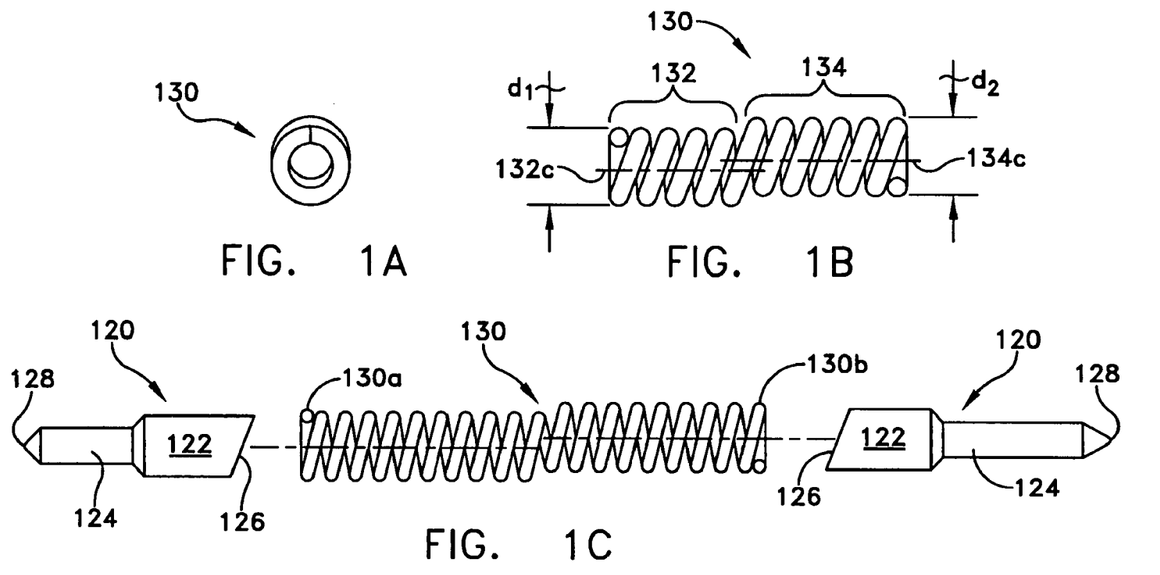
FIGS. 1A and 1B illustrate a top and side view of a compression spring comprising two sections of coils, each comprising a centerline spaced apart and parallel from the other.
FIG. 1C illustrates an exploded view of an electronic test probe utilizing the compression spring shown in FIGS. 1A and 1B, and including two plungers, each with a probe tip disposed at one end, and a bias-cut surface disposed at the opposite end.
Figure 1D:
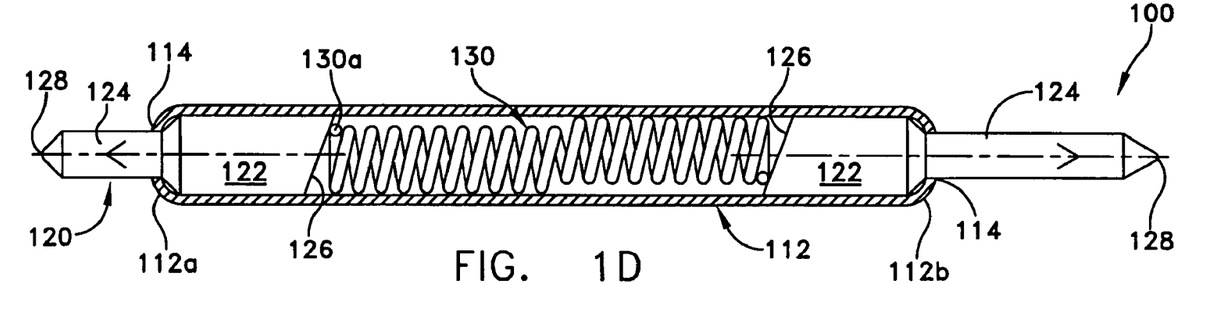
FIG. 1D illustrates a sectional view of the electronic test probe shown in FIG. 1C.

Each plunger 120 can comprise a substantially cylindrical body 122, which can comprise an outer diameter sized and dimensioned to be received slidingly in the barrel 112. Each plunger 120 can comprise a coaxially disposed reduced diameter end 124 defining a coaxially disposed probe tip 128, and a bias-cut surface 126 disposed opposite the probe tip 128.

Biasing member 130 is illustrated herein as a compression spring, but it should be understood that other types of biasing members can be utilized (e.g., cantilever beam biasing members, bellows contact biasing members, and/or the like, and combinations comprising at least one of the foregoing). For convenience, biasing member 130 will be referred to hereinafter as a compression spring or spring. Spring 130 can comprise a substantially longitudinal cylindrical shape comprising opposing ends, each end terminating in a terminating coil, which is closed square. Spring 130 can define a first coil section 132 and a second coil section 134 adjacent to the first coil section 132. The first coil section 132 can define a first centerline 132c and the second coil section 134 can define a second centerline 134c, such that the centerlines 132c and 134c are spaced apart and parallel to one another. The first and second coil sections 132, 134 also define first and second diameters $d_1$, $d_2$, which can be the same or different.

Assembling the test probe can comprise disposing the spring and plungers in the barrel such the probe tip of each plunger extends from one of the openings in the barrel, and each end of the spring is disposed against one of the bias-cut surfaces of the plunger.

Figure 2A:
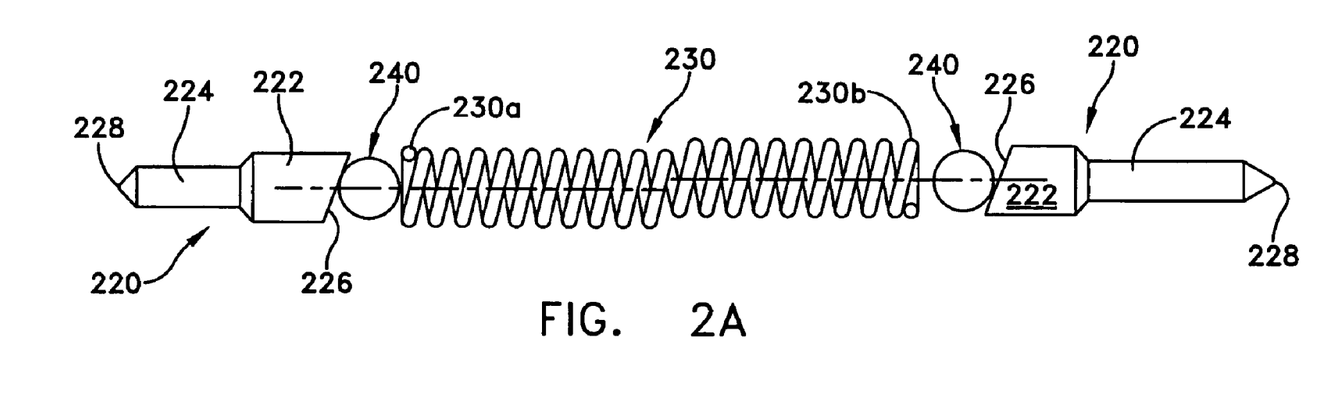
FIG. 2A illustrates an exploded view of an electronic test probe utilizing the compression spring and bias-cut plungers shown in FIGS. 1A-1D, and including a ball bearing disposed between each the bias-cut plunger surface and each end of the compression spring.
Figure 2B:
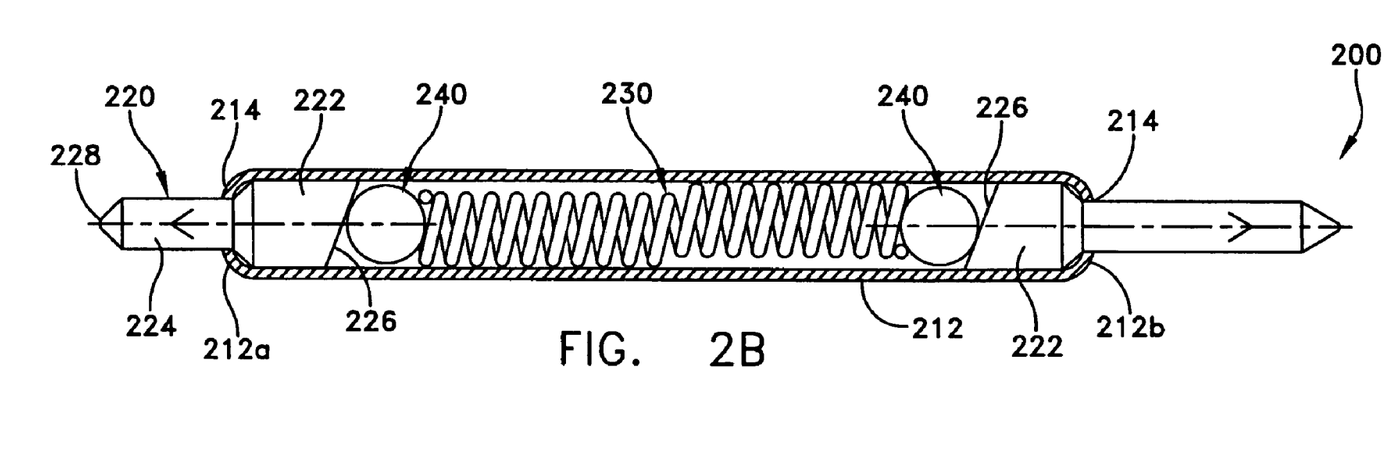
FIG. 2B illustrates a sectional view of the electronic test probe shown in FIG. 2A.

FIG. 2 shows another embodiment of an exemplary electronic test probe 200, which can comprise the same barrel 212, plungers 220 and spring 230 as in the previous embodiment, and which can further comprise a ball bearing 240 disposed between each end 230a,b of the spring 230 and the bias-cut surfaces 226 of the plungers 220. The same materials and methods used in the previous embodiment can be used to form the present test probe 200.

Assembling the test probe can comprise disposing the spring and plungers in the barrel such the probe tip of each plunger extends from one of the openings in the barrel, disposing the spring in the barrel, and disposing a ball bearing between each end of the spring and one of the bias-cut surfaces of the plunger.

Figure 3A:
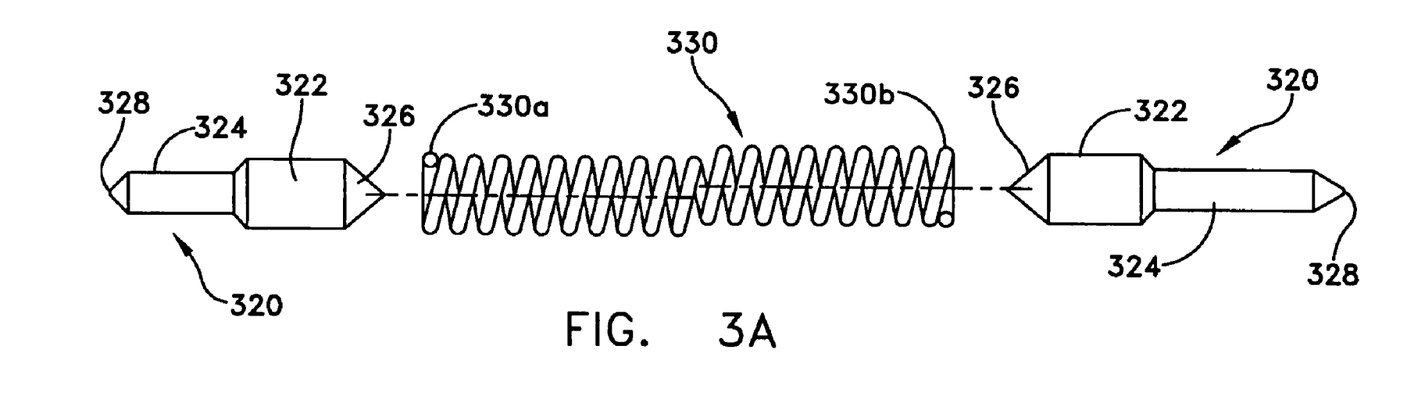
FIG. 3A illustrates an exploded view of an electronic test probe utilizing the compression spring shown in FIGS. 1A-1B, and including two plungers, each with a probe tip disposed at one end, and a conical head disposed at the opposite end.
Figure 3B:
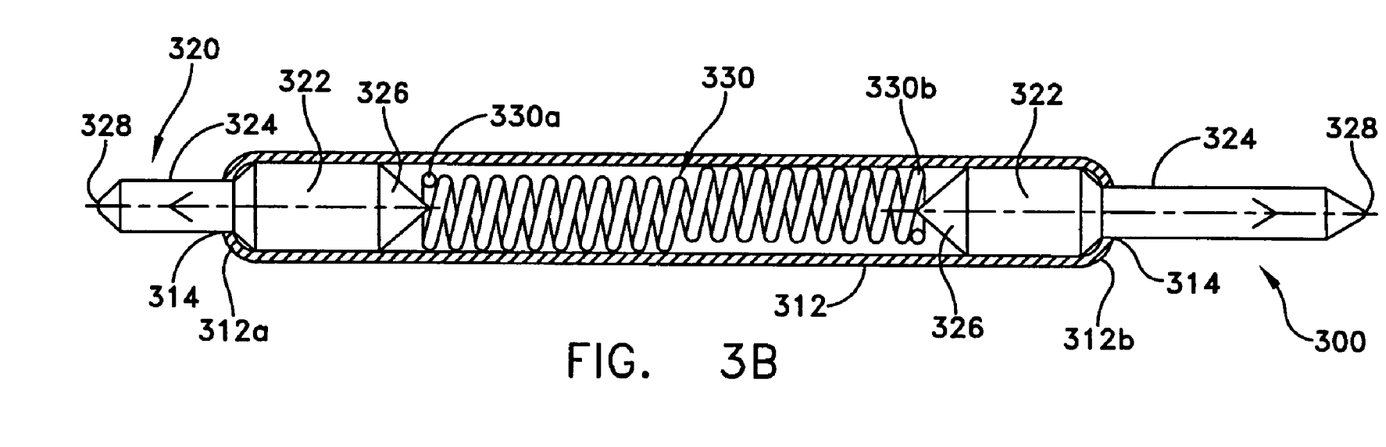
FIG. 3B illustrates a sectional view of the electronic test probe shown in FIG. 3A.

FIG. 3 shows another embodiment of an exemplary electronic test probe 300, which can comprise the same barrel 312 and spring 330 as in the previous embodiment. Each plunger 320 can comprise a substantially cylindrical body 322 having an outer diameter sized and dimensioned to be slidingly received in the barrel 312. Each plunger 320 can comprise a coaxially disposed reduced diameter end 324 disposed at one end of the body 322, which defines a coaxially disposed probe tip 328. An outwardly extending conical head 326 can be disposed opposite the probe tip 328.

Assembling the test probe can comprise disposing the spring and plungers in the barrel such the probe tip of each plunger extends from one of the openings in the barrel, and disposing the spring in the barrel such that each end of the spring is disposed against one of the conical ends of the plunger, such that the conical end is disposed coaxially in the end coils of the spring.

Figure 4A:
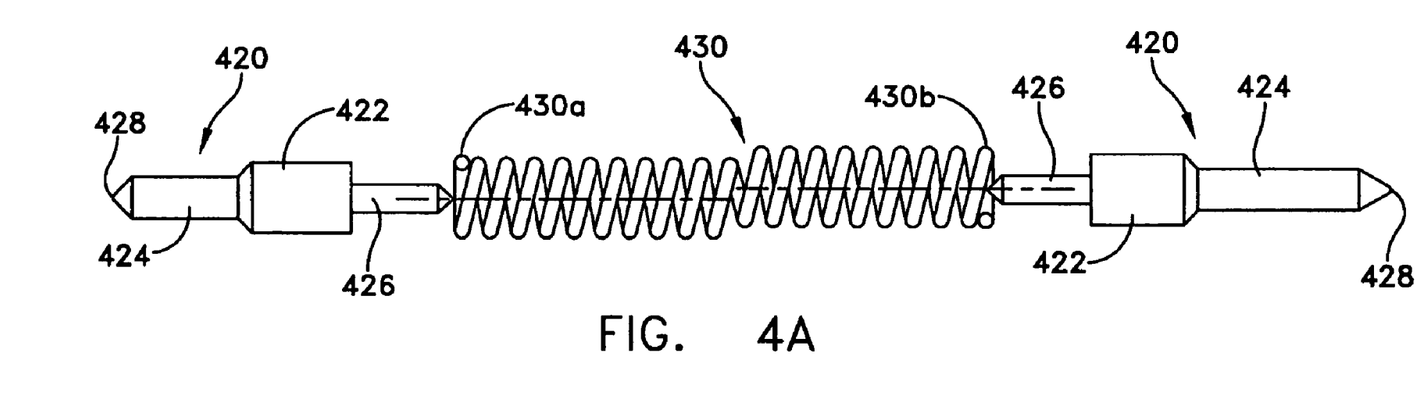
FIG. 4A illustrates an exploded view of an electronic test probe utilizing the compression spring shown in FIGS. 1A-1B, and including two plungers, each with a probe tip disposed at one end and a posts disposed at the opposite end.
Figure 4B:
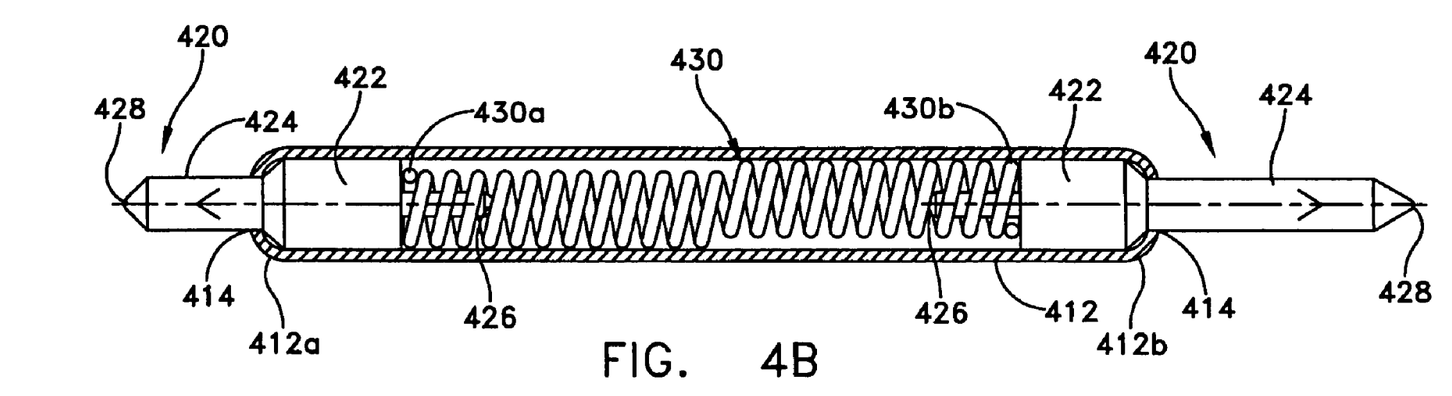
FIG. 4B illustrates a sectional view of the electronic test probe shown in FIG. 4A.

FIG. 4 shows another embodiment of an exemplary electronic test probe 400, which can comprise the same barrel 412 and spring 430 as in the previous embodiment.

Each plunger 420 can comprise a substantially cylindrical body 422 having an outer diameter sized and dimensioned to be slidingly received in the barrel 412. Each plunger 420 can comprise coaxially disposed reduced diameter ends 424, 426 disposed at each end of the body 422. One of the reduced diameter ends can define a coaxially disposed probe tip 428, and the other reduced diameter end can define an outwardly extending post 426.

Assembling the test probe can comprise disposing the spring and plungers in the barrel such the probe tip of each plunger extends from one of the openings in the barrel, and disposing the spring in the barrel such that each end of the spring is disposed against one of the conical ends of the plunger, such that the post is disposed coaxially in the end coils of the spring.

Figure 5A:
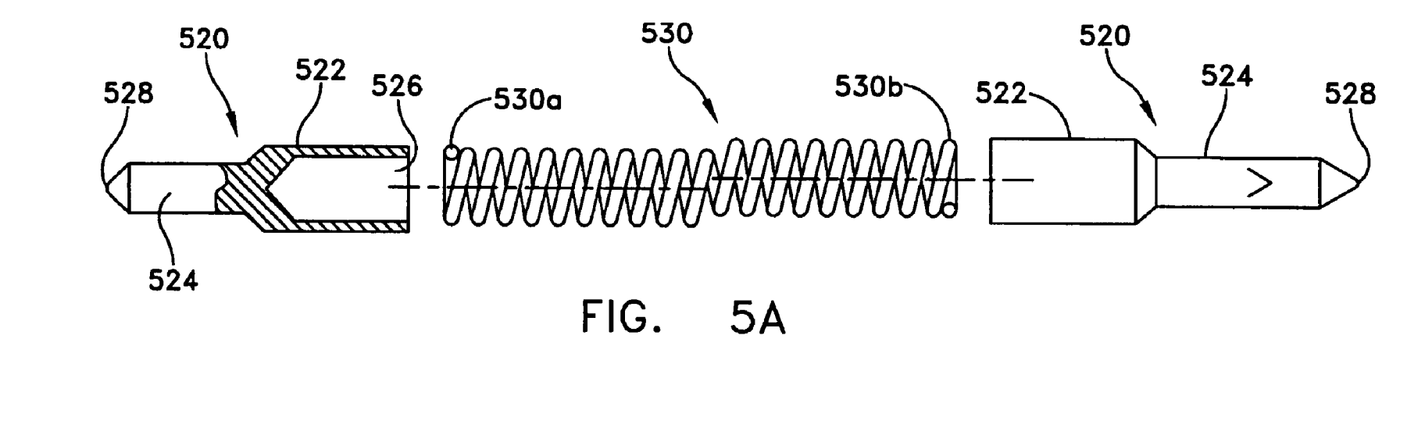
FIG. 5A illustrates an exploded view of an electronic test probe utilizing the compression spring shown in FIGS. 1A-1B, and including two plungers, each with a probe tip disposed at one end and a coaxial bore disposed in the opposite end.
Figure 5B:
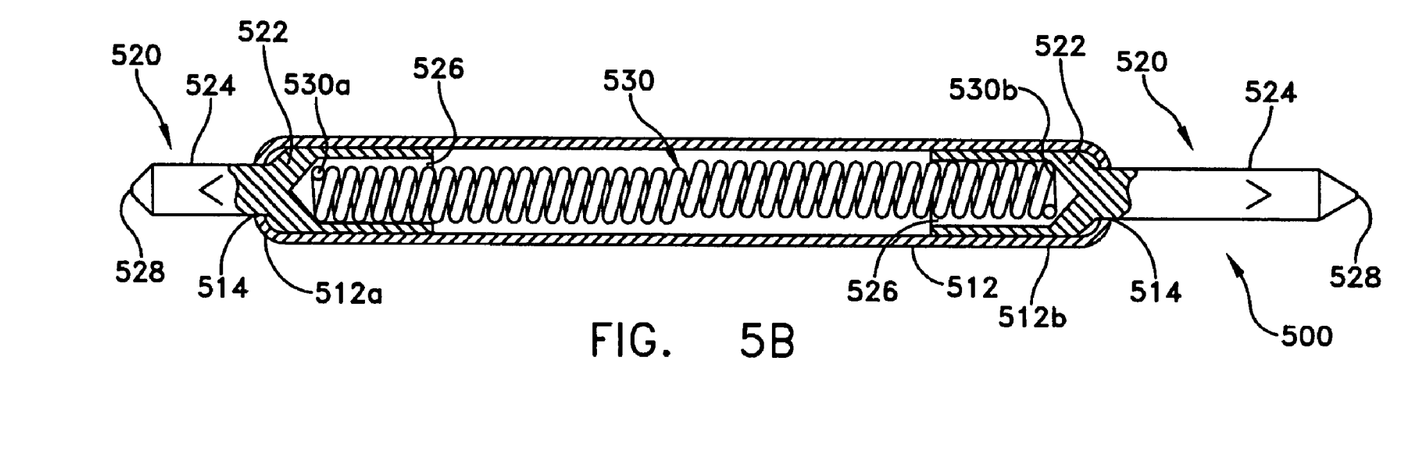
FIG. 5B illustrates a sectional view of the electronic test probe shown in FIG. 5A.

FIG. 5 shows another embodiment of an exemplary electronic test probe 500, comprising the same barrel 512 and spring 530 as in the previous embodiment. Each plunger 520 can comprise a substantially cylindrical body 522 having an outer diameter sized and dimensioned to be slidingly received in the barrel 512. Each plunger 520 can comprise a coaxially disposed reduced diameter end 524 disposed at one end of the body 524, which can define a coaxially disposed probe tip 528. A coaxially disposed bore 526 is defined in the body opposite the probe tip 528.

Assembling the test probe comprises disposing the spring and plungers in the barrel such the probe tip of each plunger extends from one of the openings in the barrel, and disposing the spring in the barrel such that each end of the spring is disposed coaxially in one of the bores of the plungers.

In operation, when a force is exerted on any of the foregoing test probes, the design of the springs can cause the end of the spring and the exterior of the plunger body to be forced against the interior of the barrel. As a result, the side load is increased, thereby increasing the physical and/or electrical contact between the exterior of the plunger and the interior of the barrel. This results in an increase in the amount of electrical current that flows through the barrel, rather than through the spring, thereby minimizing the contact resistance of the test probe.

FIG. 6 shows another embodiment of an exemplary electronic test probe 600, comprising the same barrel 612 as in previous embodiments, and comprising a plunger 620 with an outwardly extending conical head as shown in FIG. 3C. The spring 630 can comprise a substantially longitudinal cylindrical shape comprising opposing ends 630a,b and defining three (3) coil sections, namely, a first coil section 632, a second coil section 634, and a third coil section 636. Each of the coil sections 632, 634, 636 defines a centerline and a diameter, namely, the first coil section 632 defines a first centerline 632c and a first diameter $d_3$; the second coil section 632 defines a second centerline 632c and a second diameter $d_4$; and the third coil section 632 defines a third centerline 632c and a third diameter $d_5$. The first coil section 632 can be disposed between the second and third coil sections 634, 636. In the present embodiment, the centerlines 632c, 634c and 636c are all spaced apart and parallel to one another, and the diameters $d_4$ and $d_5$ of the second and third coil sections 634, 636 can be less than the diameter $d_3$ of the first coil section 632.

Figure 6A:
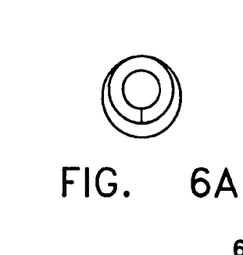
FIGS. 6A and 6B illustrate a top and side view of a compression spring comprising a first coil section disposed between two offset and reduced diameter coil sections.
Figure 6B:
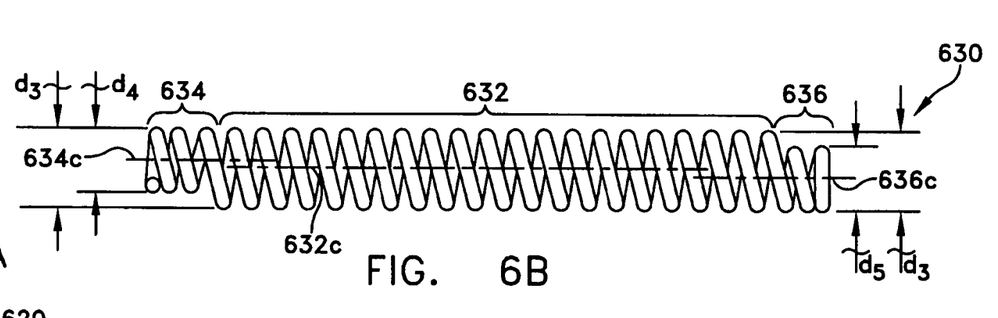
Figure 6C:
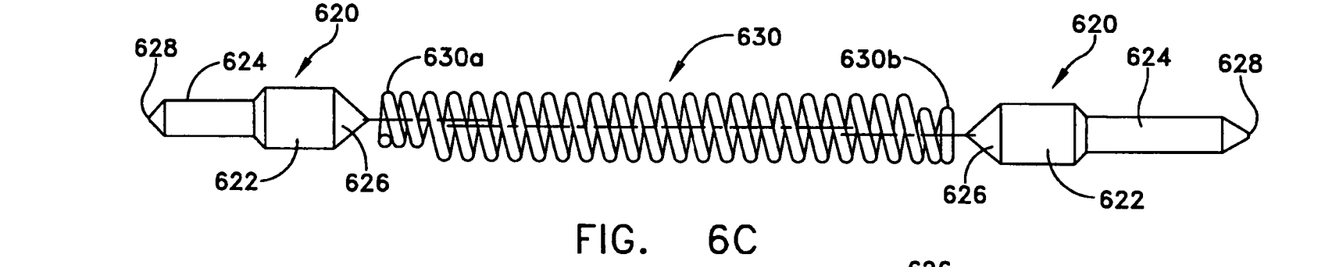
FIG. 6C illustrates an exploded view of an electronic test probe utilizing the compression spring shown in FIGS. 6A-6B, and including two plungers with conical heads as shown FIG. 3A.
Figure 6D:
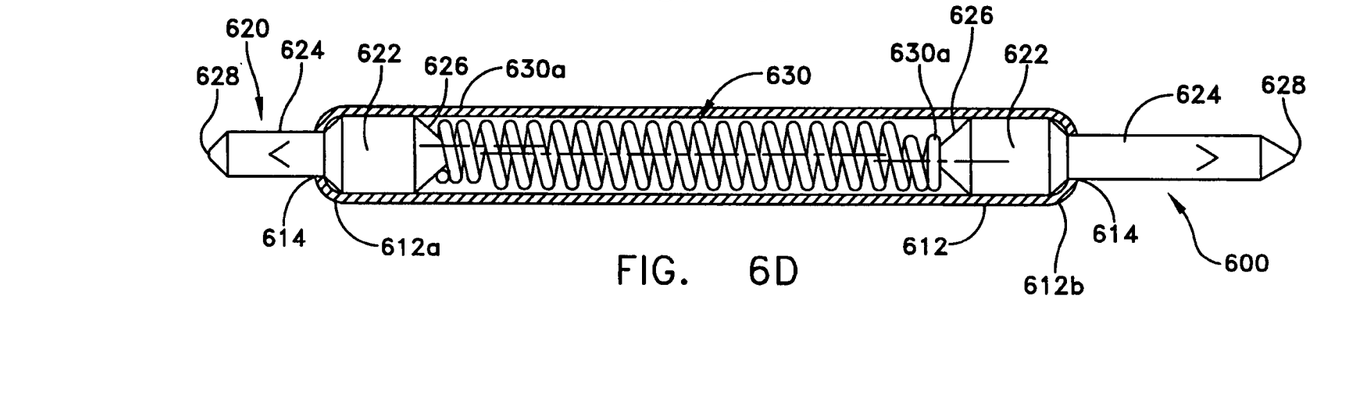
FIG. 6D illustrates a sectional view of the electronic test probe shown in FIG. 6C.

Assembling the test probe can comprise disposing the spring and plungers in the barrel such the probe tip of each plunger extends from one of the openings in the barrel, and disposing the spring in the barrel such that each end of the spring is disposed against one of the conical ends of the plunger, such that the conical end is disposed coaxially in the end coils of the spring.

In operation, a longitudinal force exerted on the test probe causes a side alignment of the plunger, and the reduced diameter of the end coils against the conical end of the plunger causes a rotational moment. As a result, physical and electrical contact between the exterior of the plunger and the interior of the barrel is maintained, increasing the amount of electrical current that flows through the barrel, rather than through the spring, thereby minimizing the contact resistance of the test probe.

Figures 7A, 7B:
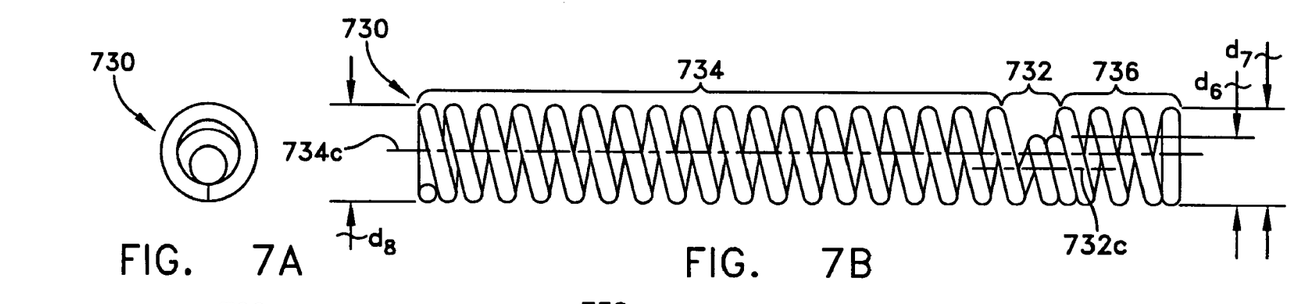
FIGS. 7A and 7B illustrate a top and side view of a compression spring comprising a two coil sections with an offset and reduced diameter coil section disposed therebetween.
Figure 7C:
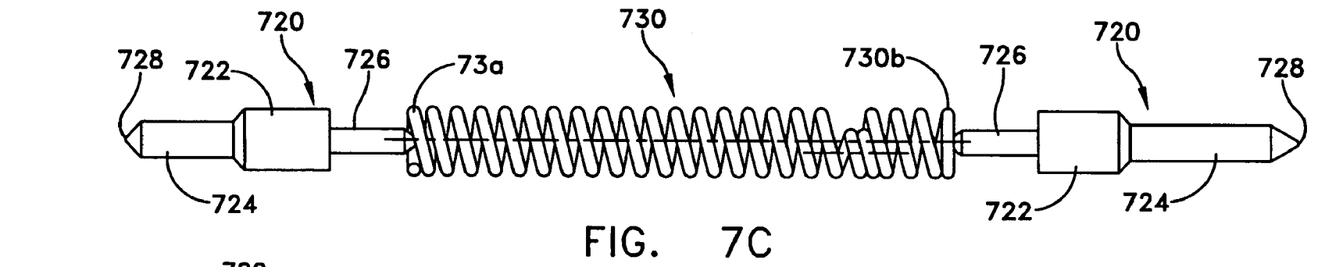
FIG. 7C illustrates an exploded view of an electronic test probe utilizing the compression spring shown in FIGS. 7A-7B, and including two plungers with post heads as shown in FIG. 4A.
Figure 7D:
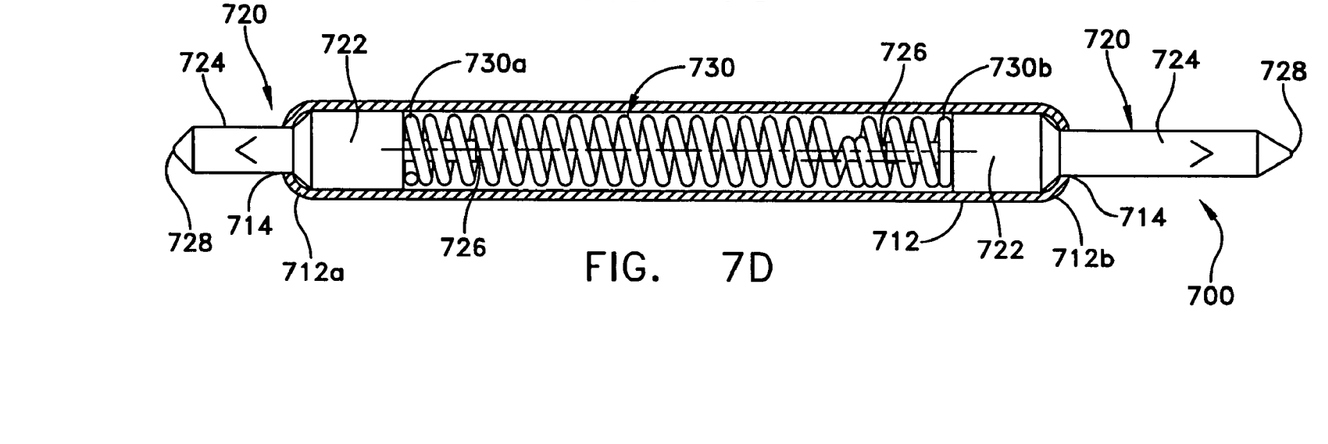
FIG. 7D illustrates a sectional view of the electronic test probe shown in FIG. 7C.

FIG. 7 shows another embodiment of an exemplary electronic test probe 700, comprising the same barrel 712 as in previous embodiments, and a plunger 720 with an outwardly extending post head 726 as shown in FIG. 4A. The spring 730 can comprise a substantially longitudinal cylindrical shape comprising opposing ends 730a,b, and defining three (3) coil sections, namely a first coil section 732, a second coil section 734, and a third coil section 736. The first coil section 732 can be disposed between the second and third coil sections 734,736. Each of the coil sections 732, 734, 736 defines a centerline and a diameter, namely, the first coil section 732 defines a first centerline 732c and a first diameter $d_6$; the second coil section 734 defines a second centerline 734c and a second diameter $d_7$; and the third coil section 736 defines a third centerline 736c and a third diameter $d_8$. In the present exemplary embodiment, the centerlines 732c, 734c and 736c are all spaced apart and parallel to one another, and the diameters $d_7$ and $d_8$ of the second and third coil sections 734, 736 can be greater than the diameter of the first coil section $d_6$.

Assembling the test probe can comprise disposing the spring and plungers in the barrel such the probe tip of each plunger extends from one of the openings in the barrel, and disposing the spring in the barrel such that each end of the spring is disposed against one of the conical ends of the plunger, such that the post is disposed coaxially in the end coils of the spring.

In operation, when a force is exerted on the test probe, the reduced diameter coils can causes a twisting moment of the plunger, thereby causing the exterior of the plunger to slide against the interior of the barrel.

Figures 8A, 8B, 8C:
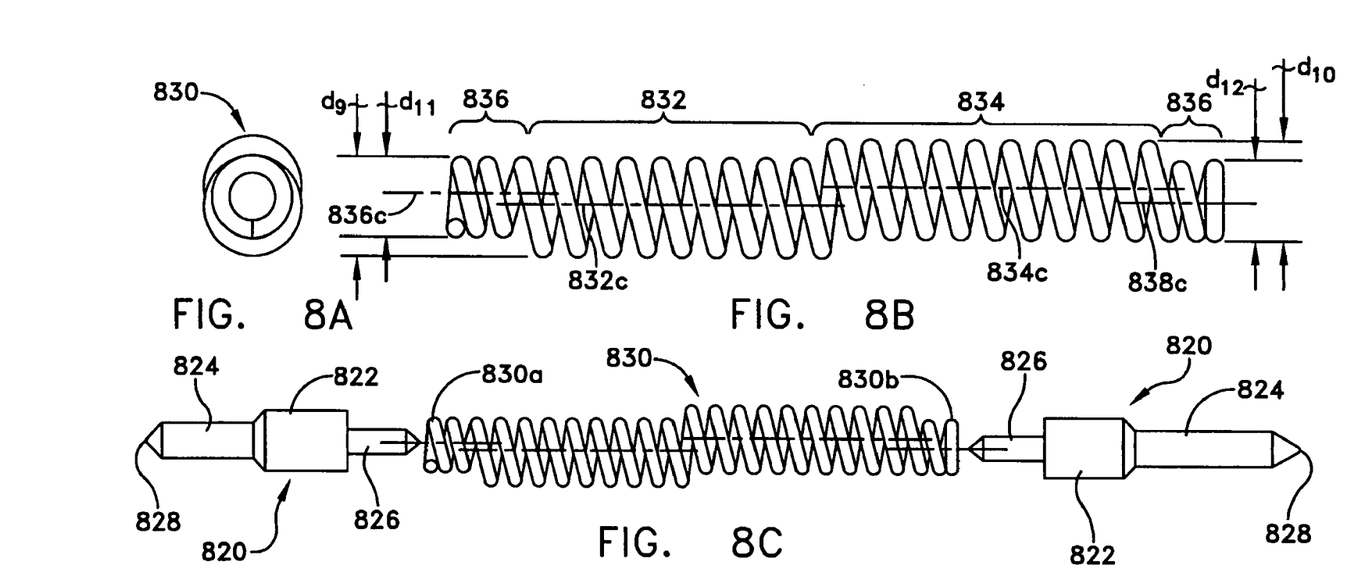
FIGS. 8A and 8B illustrate a top and side view of a compression spring comprising four sections of coils.
FIG. 8C illustrates an exploded view of an electronic test probe utilizing the compression spring shown in FIGS. 8A-8B, and including two plungers with post heads as shown in FIG. 4A.
Figure 8D:
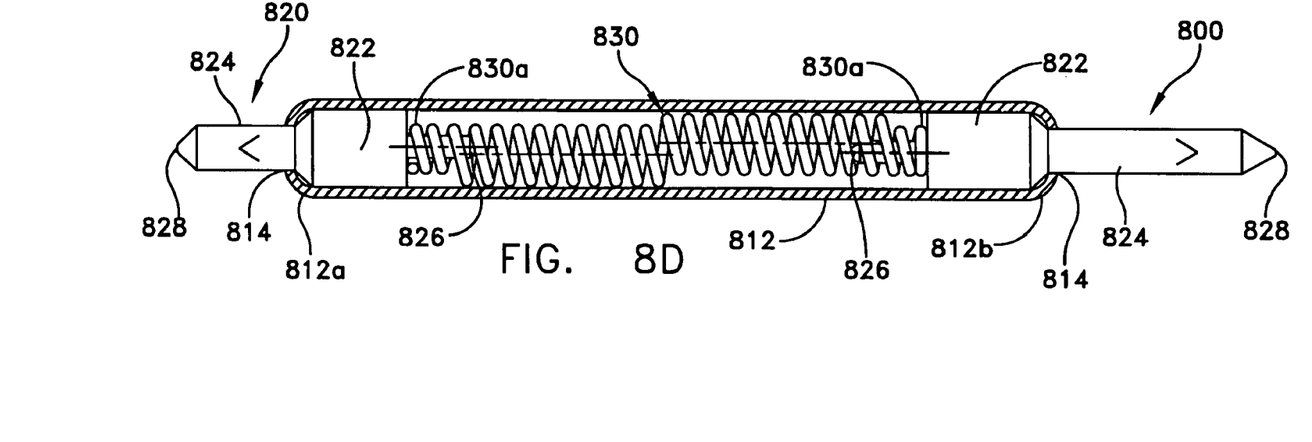
FIG. 8D illustrates a sectional view of the electronic test probe shown in FIG. 8C.

FIG. 8 shows another embodiment of an exemplary electronic test probe 800, comprising the same barrel 812 as in previous embodiments, and a plunger 820 comprising an outwardly extending post head 826 as shown in FIGS. 4A and 7C. In the present embodiment, the spring 830 comprises a substantially longitudinal cylindrical shape comprising opposing ends 830a,b, and defines four (4) coil sections, namely a first coil section 832, a second coil section 834, a third coil section 836, and a fourth coil section 838. The first coil section 832 is disposed adjacent to the second coil section 834, the third coil section 836 is disposed adjacent to the first coil section 832, and the fourth coil section 838 is disposed adjacent to the second coil section 834. Each of the coil sections defines a centerline and a diameter, namely, first coil section 832 defines a first centerline 832c and a first diameter $d_9$; second coil section 834 defines a second centerline 834c and a second diameter $d_{10}$; third coil section 836 defines a third centerline 836c and a third diameter $d_{11}$; and fourth coil section 838 defines a fourth centerline 838c and a fourth diameter $d_{12}$. In the present exemplary embodiment, the centerlines 832c, 834c, 836c and 838c are all spaced apart and parallel to one another. Also in the present exemplary embodiment, the diameters $d_9$ and $d_{10}$ of the first and second coil sections 832, 834 are substantially the same, the diameters $d_{11}$ and $d_{12}$ of the third and fourth coil sections 836, 838 are substantially the same, and are less than the diameters $d_9$ and $d_{10}$ of the first and second coil sections 832, 834.

Assembling the test probe can comprise disposing the spring and plungers in the barrel such the probe tip of each plunger extends from one of the openings in the barrel, and disposing the spring in the barrel such that each end of the spring is disposed against one of the conical ends of the plunger, such that the post is disposed coaxially in the end coils of the spring.

In operation, when the plunger posts are inserted into the reduced diameter end coils of the spring, it causes them to naturally align in an eccentric manner. When the spring and plunger are disposed in a cylindrical barrel with straight sidewalls, they become aligned in a concentric manner, causing the external surface of the plungers to be forced against the inside surface of the barrel.

Suitable materials for any of the foregoing barrels can comprise any electrically and thermally conductive material capable of withstanding the conditions in which the test probes will be utilized. Possible materials for the barrels can comprise brass, nickel, steel, stainless steel, and/or the like. Optionally, the surface of the barrels can comprise a coating of an electrically conductive material such as, but not limited to, gold, silver, platinum, palladium, and combinations and alloys thereof. The barrels can be formed using a variety of techniques such as tube drawing, deep drawing, automatic lathing, and/or the like. Optionally, other parts of the test probes can comprise a coating of the foregoing electrically conductive materials.

Suitable materials for any of the foregoing plungers can comprise any material having sufficient strength to withstanding the forces on the test probes, and capable of withstanding the conditions in which the test probes will be utilized. Possible materials for the plungers include, but are not limited to, steel, beryllium-copper, and/or the like, and combinations comprising at least one of the foregoing). The plungers can be formed using a variety of techniques such as automatic lathing, and the like. Optionally, the surface of the plungers can comprise a coating of an electrically conductive material such as, but not limited to, gold, silver, platinum, palladium, and combinations and alloys thereof.

Suitable materials for any of the foregoing compression springs can comprise any material that is capable of exerting a biasing force, and that is capable of withstanding the conditions in which the test probes will be utilized. Examples of suitable materials for the spring include relatively high tensile strength materials such as, but not limited to, stainless steel wire, music wire, and/or the like, and combinations comprising at least one of the foregoing. The springs can be formed using a variety of techniques (e.g., a coil winding machine, and the like).

Formation of the test probes can comprise forming the housing, biasing members, and plungers using any of the techniques described above. The spring can be formed by forming a plurality of coils having substantially the same diameter followed by defining the first and second coil sections (and corresponding spaced apart and parallel centerlines) by bending a region between the ends of the spring using a predetermined amount of force (e.g., with a coil winding machine).

Any combination of springs, plungers and contact tips can be used, provided that the combination results in a consistent normal force of the plunger against the interior sidewall of the barrel. For example, although the springs are illustrated herein as comprising closed end terminating coils, it should be understood that other types of terminating coil arrangements can be used (e.g., the ends of the spring can comprise full, half, and quarter turns of the terminating coil(s), and/or the like, with square ends, round ends, etc., which are open, closed, tapered, tucked in, turned in, and/or the like). Similarly, other arrangements of coil sections can be utilized other than those illustrated herein can be used, as well as other plunger geometries.

The test probes: 1) can provide contact resistance that is lower than test probes without a biasing member (e.g., less than or equal to about 50 milliohms, more particularly about 25 milliohms to about 50 milliohms, more particularly still about 10 milliohms to about 35 milliohms); 2) can provide more consistent contact resistance than other test probes without a biasing member; 3) can provide reduced material and manufacturing costs due to the elimination of internal components used in other test probes that comprise biasing members (e.g., a ball bearing, and the like); 4) can provide reduced material and manufacturing costs due to the elimination of components that are difficult to fabricate (e.g., a bias-cut plunger, and the like); and 5) can provide increased durability in comparison to test probes with external springs.

While this disclosure has been particularly shown and described with references to preferred embodiments thereof, it will be understood by those skilled in the art that various changes in form and details may be made therein without departing from the spirit and scope of the disclosure.

What is claimed is:

1. An electronic test probe, comprising:
    a substantially cylindrical housing with a first end and a second end, and an opening disposed in the first end;
    a plunger disposed in the housing, the plunger comprising a first end and a second end opposite the first end, the first end of the plunger extending through the opening in the first end of the housing; and
    a compression spring disposed in the housing in engagement with the second end of the plunger, the compression spring comprising a first section of coils comprising a first centerline and a second section of coils comprising a second centerline spaced apart from and parallel to the first centerline.

2. The electronic test probe of claim 1, wherein the first section of coils comprises a first diameter and the second section of coils comprises a second diameter, and the first diameter is substantially the same as the second diameter.

3. The electronic test probe of claim 1, further comprising a third section of coils disposed between the first and second sections of coils, the third section of coils comprising a third centerline spaced apart from and parallel to the first and second centerlines, the third section of coils comprising a third diameter less than the diameter of the first and second sections of coils.

4. The electronic test probe of claim 1, further comprising a third section of coils disposed between the first and second sections of coils, the third section of coils comprising a third centerline spaced apart from and parallel to the first and second centerlines, the third section of coils comprising a third diameter greater than the diameter of the first and second sections of coils.

5. The electronic test probe of claim 1, further comprising a third section of coils disposed at a first end of the compression spring and a fourth section of coils disposed at a second end of the compression spring, the third section of coils comprising a third centerline spaced apart from and parallel to the first and second centerlines, the fourth section of coils comprising a fourth centerline spaced apart from and parallel to the first, second and third centerlines, the third section of coils comprising a third diameter, the fourth section of coils comprising a fourth diameter, wherein the third and fourth diameters are less than the diameter of the first and second sections of coils.

6. The electronic test probe of claim 1, wherein the second end of the plunger comprises a coaxial bore.

7. The electronic test probe of claim 1, wherein the second end of the plunger comprises a coaxial post.

8. The electronic test probe of claim 1, wherein the second end of the plunger comprises a bias-cut end surface.

9. The electronic test probe of claim 8, further comprising a ball bearing disposed between the compression spring and the second end of the plunger.

10. The electronic test probe of claim 1, wherein the second end of the plunger comprises a conical end surface.

11. The electronic test probe of claim 4, wherein the second end of the plunger comprises a conical end surface.

12. The electronic test probe of claim 3, wherein the second end of the plunger comprises a conical end surface.

13. The electronic test probe of claim 5, wherein the second end of the plunger comprises a conical end surface.

14. The electronic test probe of claim 1, further comprising a contact resistance of about 10 milliohms to about 50 milliohms.

15. An electronic test probe, comprising:
   a substantially cylindrical housing with a first end and a second end, and an opening disposed in each of the first and second ends;
   a first plunger and a second plunger disposed in the housing, each of the first and second plungers comprising a first end extending through one of the openings disposed in the housing, and each of the first and second plungers comprising a second end, the second end comprising a bias-cut surface; and
   a compression spring disposed between the first and second plungers, the compression spring comprising a first end and a second end, the first and second ends of the compression spring each disposed in engagement with the bias-cut surface of one of the first and second plungers, the compression spring comprising a first section of coils comprising a first centerline and a second section of coils comprising a second centerline spaced apart from and parallel to the first centerline.

16. The electronic test probe of claim 15, wherein the first section of coils comprises a first diameter and the second section of coils comprises a second diameter, and the first diameter is substantially the same as the second diameter.

17. The electronic test probe of claim 15, further comprising a contact resistance of about 10 milliohms to about 50 milliohms.

18. The electronic test probe of claim 15, wherein the second end of each of the plungers comprises a surface selected from the group consisting of a coaxial bore, a coaxial post, a bias-cut end surface, a conical end surface, and combinations comprising at least one of the foregoing.

19. A method of minimizing contact resistance of an electronic test probe, comprising:
   disposing a plunger in a substantially cylindrical housing, the housing comprising a first end and a second end, and an opening disposed in the first end; the plunger comprising a first end and a second end opposite the first end, the first end of the plunger extending through the opening in the first end of the housing; and
   disposing a compression spring in the housing in engagement with the second end of the plunger, the compression spring comprising a first section of coils comprising a first centerline and a second section of coils comprising a second centerline spaced apart from and parallel to the first centerline.

20. The method of claim 19, wherein the second end of the plunger comprises a surface selected from the group consisting of a coaxial bore, a coaxial post, a bias-cut end surface, and a conical end surface and combinations comprising at least one of the foregoing.

21. The electronic test probe of claim 15, wherein each plunger slidingly disposed in the housing.

22. The electric test probe of claim 6, wherein the plunger slidably extends through the opening.

* * * * *